United States Patent [19]
Terashima et al.

[11] Patent Number: 5,874,767
[45] Date of Patent: Feb. 23, 1999

[54] SEMICONDUCTOR DEVICE INCLUDING A LATERAL POWER DEVICE

[75] Inventors: Tomohide Terashima; Kazuhiro Shimizu, both of Hyogo, Japan

[73] Assignee: Mitsubishi Denki Kabushiki Kaisha, Tokyo, Japan

[21] Appl. No.: 954,564

[22] Filed: Oct. 20, 1997

Related U.S. Application Data

[63] Continuation of Ser. No. 716,848, Sep. 10, 1996, abandoned.

[30] Foreign Application Priority Data

May 14, 1996 [JP] Japan .................................. 8-119020

[51] Int. Cl.$^6$ ............................. H01L 23/58; H01L 29/00
[52] U.S. Cl. .......................... 257/487; 257/491; 257/500
[58] Field of Search ................................... 257/487, 488, 257/490, 491, 493, 500, 501, 502

[56] References Cited

U.S. PATENT DOCUMENTS

| | | | |
|---|---|---|---|
| 5,072,287 | 12/1991 | Nakagawa et al. .................... | 257/500 |
| 5,428,241 | 6/1995 | Terashima ............................. | 257/409 |

FOREIGN PATENT DOCUMENTS

| | | | |
|---|---|---|---|
| 0 236 200 | 9/1987 | European Pat. Off. ............... | 257/502 |
| 0337823A | 10/1989 | European Pat. Off. . | |
| 4041050A | 7/1991 | Germany . | |

OTHER PUBLICATIONS

Goodenough, "Electronic Design", vol. 33, No. 21 pp. 113–122, Sep. 1985.
F. Goodenough, "Electronic Design," vol. 33, No. 21, Sep 1985, pp. 113–122.
R. Schuett, "Neue Leistungshalbleiter Schalten Schneller Bericht Von Der Etg–Fachtagung 'Abschaltbare Elemente Der Leistungselektronik Und Ihre Anwendungen,'" Elektrotechnik, vol. 70, No. 10, Jun. 7, 1988, pp. 46–48.
S. Mukherjee, A High Current Power IC Technology Using Trench DMOS Power Device, Institute of Electrical and Electronics Engineers, Proceedings of the International Electron Devices Meeting, Washington, D.C., Dec. 8–11, 1991, pp. 91/145–148.
A.W.Ludikhuize, "A Versatile 250/300–V IC Process for Analog and Switching Applications"IEEE Transactions on Electron Devices, vol. ED–33 No. 12, Dec. 1996, pp. 2008–2015.

*Primary Examiner*—Wael Fahmy
*Attorney, Agent, or Firm*—McDermott, Will & Emery

[57] ABSTRACT

A high breakdown voltage pch-MOSFET having a breakdown voltage of 150 V or more and a control element controlling the same are formed in a common $n^-$ epitaxial layer. Only an n-type region of $n^-$ epitaxial layer is distributed at a region located between the high breakdown voltage pch-MOSFET and the control element and extending along the substrate surface. A semiconductor device thus formed achieves a good throughput and reduces a required chip area.

9 Claims, 12 Drawing Sheets

SEMICONDUCTOR DEVICE INCLUDING A LATERAL POWER DEVICE

This application is a continuation of application Ser. No. 08/716,848 filed Sep. 10, 1996 now abandoned.

BACKGROUND OF THE INVENTION

1. Field of the Invention

The present invention relates to a semiconductor device, and in particular to a semiconductor device including a lateral power device.

2. Description of the Background Art

Power IC (Integrated Circuit), which include power elements allowing a large current and having a high breakdown voltage as well as their drive circuits and protection circuits integrated integrally with the power elements, will be the mainstream of power elements hereafter. It is preferable to perform gate driving in such a power element by a system of a voltage control type using an insulated gate electrode (MOS (Metal Oxide Semiconductor) gate). In this voltage control type, the gate driving requires a smaller current compared with a current driving type.

Among integrated circuits (ICs) each including a plurality of semiconductor elements integrated on a single semiconductor substrate, ICs including high breakdown voltage elements are called power ICs. High breakdown voltage elements generally include MOS gates such as power MOSFETs (Field Effect Transistors) and IGBTs (Insulated Gate Bipolar Transistors), and such elements are achieved by RESURF (Reduced Surface Field) technologies.

The RESURF technology which was named by Apple Corporation and others in 1997 is essentially the same as the offset gate technology which is used for accomplishing the lateral MOS transistor with a high breakdown voltage.

A conventional semiconductor device will be described below as an example of a structure for achieving a level shift function with a high breakdown voltage pch-MOSFET having the RESURF structure.

FIG. 16 is a plan schematically showing a structure of a conventional semiconductor device. FIG. 17 is a schematic cross section taken along line D–D' in FIG. 16.

Referring to FIGS. 16 and 17, n⁻ epitaxial layers 103a and 103b are formed at a surface of p⁻ silicon substrate 101 and are spaced from each other with a p-type isolation diffusion region 105 therebetween. Each of n⁻ epitaxial layers 103a and 103b is surrounded at the surface of silicon substrate 101 by p-type isolation diffusion region 105, so that n⁻ epitaxial layers 103a and 103b form a high breakdown voltage pch-MOSFET formation region and a high breakdown voltage island region, respectively.

A pch-MOSFET with a high breakdown voltage is formed at n⁻ epitaxial layer 103a which is the high breakdown voltage pch-MOSFET formation region. The high breakdown voltage pch-MOSFET has a p-type diffusion region 111 forming a source, a p-type diffusion region 113 forming a drain, a gate insulating layer 115 and a gate electrode layer 117. Source region 111 and drain region 113 are formed at a surface of n⁻ epitaxial layer 103a with a space between each other. In particular, drain region 113 is formed of a two-layer structure including a relatively lightly doped p⁻ diffusion region 113a and a relatively heavily doped p-type diffusion region 113b. A gate electrode layer 117 is formed on a region, which is located between source region 111 and drain region 113, with gate insulating layer 115 therebetween.

An n⁺ buried diffusion region 107a located immediately under source region 111 is formed between n⁻ epitaxial layer 103a and p⁻ silicon substrate region 101.

The high breakdown voltage pch-MOSFET has a track-like form in a plane as shown in FIG. 16. More specifically, drain region 113 formed at the surface of substrate 101 surrounds source region 111 with a predetermined distance therebetween.

At a central region surrounded by source region 111 having a track-like planar configuration, there is formed an n⁺ diffusion region 121 adjoining to source region 111.

At n⁻ epitaxial layer 103b forming the high breakdown voltage island region, there is formed a circuit (not shown) for controlling an operation of high breakdown voltage pch-MOSFET 110. An n⁺ buried diffusion region 107b is formed between n⁻ epitaxial layer 103b and p⁻ silicon substrate region 101.

Conductive layers 141 forming field plates are formed above a region at which n⁻ epitaxial layer 103a and p-type diffusion region 105 are in contact with each other and a region at which n⁻ epitaxial layer 103b and p-type diffusion region 105 are in contact with each other.

An insulating layer 123 covering gate electrode layer 116, field plates 141 and others is formed on the surface of p-type silicon substrate 101. Insulating layer 123 is provided with a contact hole 123a reaching surfaces of source region 111 and n⁺ diffusion region 121, a contact hole 123g reaching a partial surface of gate electrode layer 117, a contact hole 123b reaching a partial surface of p-type diffusion region 113b, and a contact hole 123c reaching a partial surface of p-type isolation region 105.

A source electrode 125a is electrically connected to source region 111 and n⁺ diffusion region 121 through contact hole 123a. An aluminum interconnection layer 143 is electrically connected to gate electrode layer 117 through contact hole 123g. Source electrode 125a and aluminum interconnection layer 143 are electrically connected to elements formed at the high breakdown voltage island region.

A drain electrode 125b which is electrically connected to p-type diffusion region 113b through contact hole 123b is connected via a resistor 127 to an aluminum interconnection layer 125c which is electrically connected to p-type isolation diffusion region 105 through contact hole 123c.

When a control circuit in the high breakdown voltage island region negatively biases aluminum interconnection layer 143 with respect to source electrode 125a, the high breakdown voltage pch-MOSFET is turned on. Thereby, a current flows through resistor 127 and a voltage signal is generated. In this manner, the level shift-down function is achieved.

In the conventional semiconductor device described above, a high voltage is usually applied to n⁻ epitaxial layers 103a and 103b shown in FIG. 17. In the high breakdown voltage pch-MOSFET formation region, therefore, a depletion region 150 defined by dotted line in FIG. 17 expands from regions such as a pn junction between n⁻ epitaxial layer 103a and p-type isolation diffusion region 105 and a pn junction between p⁻ silicon substrate region 101 and n⁻ epitaxial layer 103a. The depletion region 150 expands into a majority of the high breakdown voltage pch-MOSFET formation region except for p-type diffusion region 113b, source region 111, n⁺ diffusion region 121, a portion of n⁻ epitaxial layer 103a and a portion of n⁺ buried diffusion region 107a. Owing to the fact that a majority of high breakdown voltage pch-MOSFET 10A is taken into depletion region 150 as described above, high breakdown voltage pch-MOSFET 10A can achieve a high breakdown voltage.

Likewise, in the high breakdown voltage island region, depletion region 150 defined by dotted line expands from a pn junction between n+ epitaxial layer 103b and p-type isolation diffusion region 105 and a pn junction between n− epitaxial layer 103b and p− silicon substrate region 101. This depletion region 150 has a configuration surrounding or extending around the high breakdown voltage island region. In general, an element such as an MOS transistor forming a circuit is not formed at the region in the high breakdown voltage island region through which depletion region 150 expands. This is because accurate operation would be difficult if such an element were taken into depletion region 150.

In the conventional semiconductor device shown in FIGS. 16 and 17, the potentials on source electrode 125a and aluminum interconnection layer 143 are controlled by a drive circuit in the high breakdown voltage island region. For this purpose, source electrode 125a and aluminum interconnection layer 143 extend from the high breakdown voltage pch-MOSFET formation region to the high breakdown voltage island region, so that they extend over p-type isolation diffusion region 105.

In general, p-type isolation diffusion region 105 surrounding n− epitaxial layer 103a is set to the lowest potential (e.g., the substrate potential). Thereby, n− epitaxial layer 103a and p-type isolation diffusion region 105 are always reversely biased, so that a depletion region of a high resistance exists at the pn junction between them, and this depletion region ensures a breakdown voltage.

However, the aluminum interconnection layer 143 and source electrode 125a, which are at a high potential and extend across this p-type isolation diffusion region 105, suppress extension of the depletion layer at the pn junction between p-type isolation diffusion region 105 and n− epitaxial layer 103a, resulting in reduction of the breakdown voltage.

In order to prevent reduction of the breakdown voltage, such methods have been employed that use insulating layer 123 having a increased thickness, that form a field plate 141 above the pn junction between n− epitaxial layer 103a and p-type isolation diffusion region 105 as shown in FIG. 17 for providing a shield against an electric field, and that employ a multilayer structure of the field plate in a floated state for stabilizing a surface electric field by capacity coupling.

However, as the breakdown voltage has been improved, it is now required to give a high insulating strength to insulating layer 123 itself between field plate 141 and aluminum interconnection layer 143 (or source electrode 125a). In order to ensure a high insulating strength, the film thickness of insulating layer 123 must be increased considerably, and therefore a long time is required for depositing insulating layer 123. As a result, a throughput decreases, and a process cost increases considerably.

The high breakdown voltage pch-MOSFET is isolated from the high breakdown voltage island region. This naturally increases a chip area.

SUMMARY OF THE INVENTION

An object of the invention is to provide a semiconductor device which can improve a throughput and requires a small chip area.

A semiconductor device of the invention includes a semiconductor substrate, a first impurity region of a first conductivity type, a second impurity region of a second conductivity type, a high breakdown voltage element and a control element.

The semiconductor substrate has a main surface. The first impurity region is formed at the main surface of the semiconductor substrate. The second impurity region surrounds a periphery of the first impurity region at the main surface. The high breakdown voltage element is formed at the main surface of the semiconductor substrate, and has a breakdown voltage of 150 V or more. The control element is formed at the main surface of the semiconductor substrate, and forms a circuit controlling the high breakdown voltage element. The high breakdown voltage element and the control element are formed at the main surface within the first impurity region. Only a region of the first conductivity type in the first impurity region is present at a region located between the high breakdown voltage element and the control element and extending along the main surface.

According to the semiconductor device of the invention, only the region of the first conductivity type is present between the high breakdown voltage element and the control element, so that an interconnection layer connecting the high breakdown voltage element and the control element is not located above the pn junction between the region of the first conductivity type and the region of the second conductivity type. Therefore, extension of a depletion layer at this pn junction is not suppressed, so that it is not necessary to increase a film thickness of the insulating layer between the interconnection layer and the substrate. Therefore, a deposition time for this insulating layer can be significantly smaller than that in the prior art, an a throughput is improved.

Since the high breakdown voltage element and the control element are formed in the same impurity region, a planar area occupied by the structure can be small. Therefore, increase in the chip area can be suppressed.

Preferably, in the above aspect, the high breakdown voltage element includes a high breakdown voltage insulated gate field effect transistor portion, which has a pair of third impurity regions of the second conductivity type disposed at the main surface and spaced from each other by a distance and a gate electrode layer formed on the main surface between the paired third impurity regions with a gate insulating layer therebetween. This high breakdown voltage insulated gate field effect transistor portion has a breakdown voltage of 150 V between the paired third impurity regions.

Preferably, in the above aspect, one of the paired third impurity regions has a heavily doped region formed at the main surface, and a lightly doped region formed at the main surface between the heavily doped region and the gate electrode and being in contact with the heavily doped region. A length of the lightly doped region along the main surface from its end near the gate electrode layer to its end near the heavily doped region is 50 μm or more.

Preferably, in the above aspect, the high breakdown voltage element is disposed nearer to the end of the first impurity region than the control element. One of the third impurity regions is disposed nearer to the end of the first impurity region than the other third impurity region.

Preferably, in the above aspect, the first impurity region has a first region and a second region having a higher impurity concentration than the first region and adjoining the first region at the main surface. One of the paired third impurity regions is formed in the first region, and the control element is formed in the second region.

Since the control element is arranged in the relatively heavily doped second region, a depletion layer is prevented from extending toward the control element. Thereby, punch-through can be prevented if the control element is an MOS transistor.

Preferably, in the above aspect, the first impurity region has a firs region and a second region having an impurity concentration higher than that of the first region and disposed in contact with a lower surface of the first region. The pair of third impurity regions and the impurity region forming the control element are formed in the first region. The second region is not disposed at a region immediately under one of the paired third regions, and is disposed at a region immediately under the impurity region forming the control element.

Since the relatively heavily doped second region is disposed at the region immediately under the control element, a depletion layer is prevented from extending from a position under the control element toward the control element. Thereby, punch-through can be prevented if the control element is an MOS transistor.

Preferably, in the above aspect, the high breakdown voltage element further includes a fourth impurity region of the first conductivity type formed at the main surface in the heavily doped region.

Preferably, in the above aspect, the structure further includes an electrode formed at the main surface and electrically connected to the fourth impurity region.

Addition of the fourth impurity region allows an IGBT operation of the high breakdown voltage element. In this IGBT, an on-current flowing in the on state can be larger than that in a conventional MOS transistor, so that the region for forming the high breakdown voltage element can be further reduced.

Preferably, in the above aspect, the electrode is electrically connected to the heavily doped region.

Connection of the heavily doped region to the electrode prevents a floating state. Therefore, even if a current amplification factor $h_{FE}$ of a bipolar transistor portion formed of the fourth impurity region, the heavily doped region and the first impurity region is large, the breakdown voltage of the bipolar transistor portion does not decrease, because the electrical connection is made between the base and emitter in this bipolar transistor. Therefore, the breakdown voltage of the high breakdown voltage element does not affect the breakdown voltage of this bipolar transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment of the invention will be described below with reference to the drawings.

Embodiment 1

Figure 1:
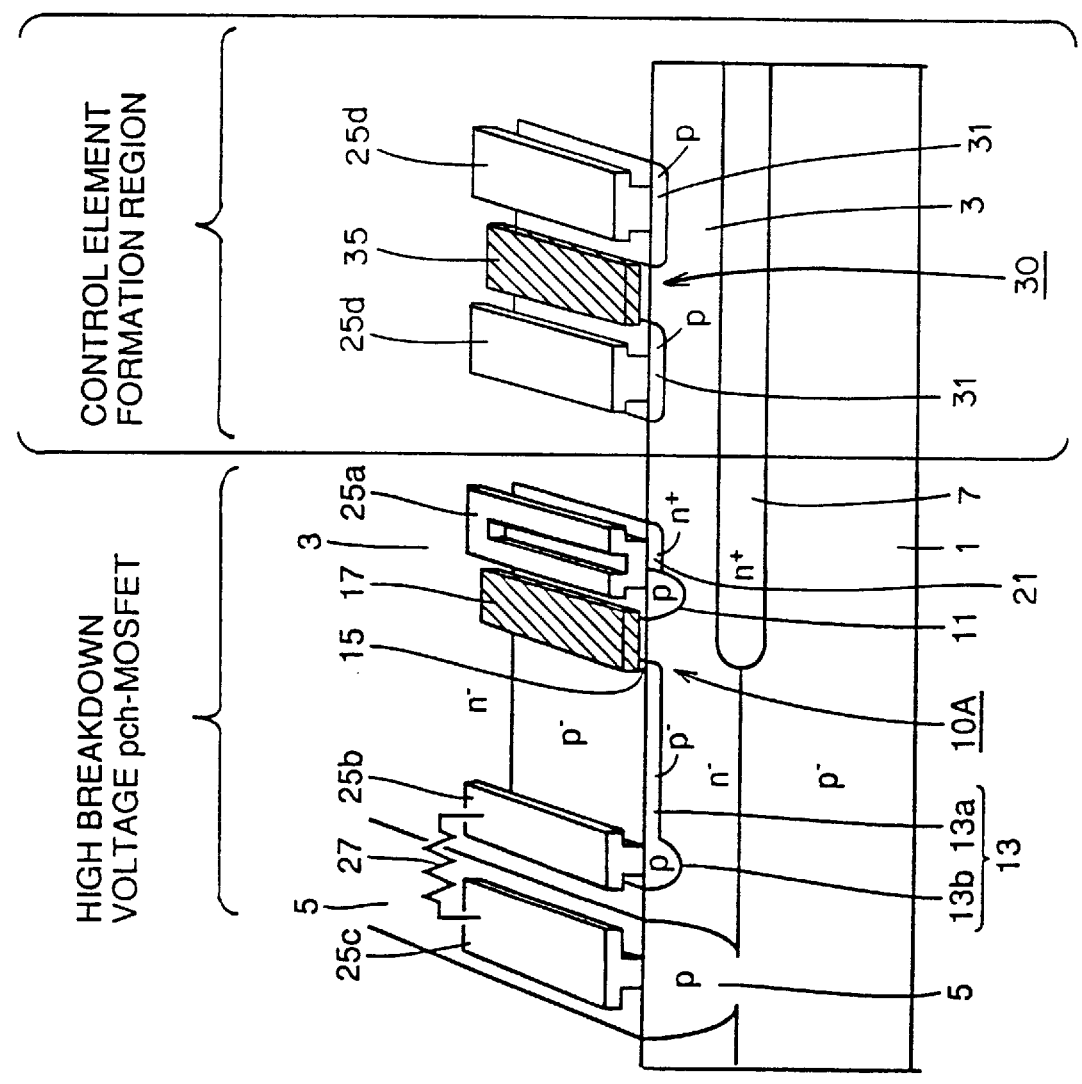
FIG. 1 is a perspective view schematically showing a structure of a semiconductor device forming a level shift structure according to an embodiment 1 of the invention.
Figure 2:
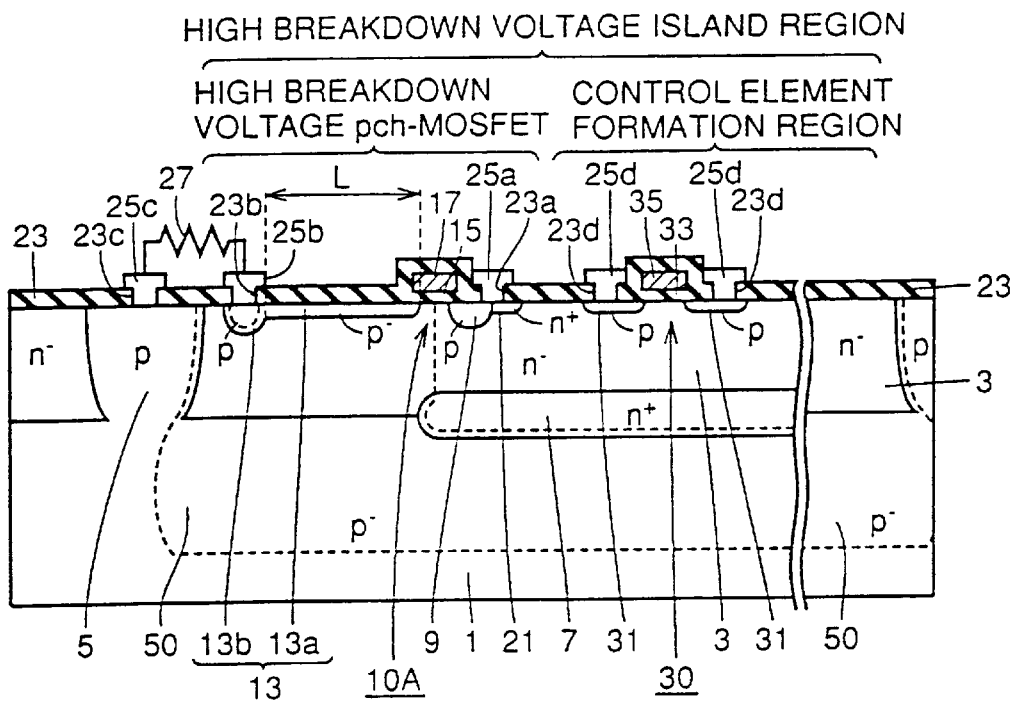
FIG. 2 is a cross section schematically showing a structure of the semiconductor device forming the level shift structure according to the embodiment 1 of the invention.

Referring to FIGS. 1 and 2, an n⁻ epitaxial layer 3 is formed at a surface of p⁻ silicon substrate 1. An n⁺ buried diffusion region 7 is in contact with a lower surface of n⁻ epitaxial layer 3. N⁻ epitaxial layer 3 is surrounded at the substrate surface by a p-type isolation diffusion region 5, and thereby forms a high breakdown voltage island region.

In this embodiment, a high breakdown voltage pch-MOSFET 10A and a control element are formed in a mixed fashion in this single high breakdown voltage island region.

High breakdown voltage pch-MOSFET 10A has a p-type diffusion region 9, a p⁻ diffusion region 13a, a p-type diffusion region 13b, a gate insulating layer 15 and a gate electrode layer 17. P-type diffusion region 9 forms a source region, and p⁻ diffusion region 13a and p-type diffusion region 13b form a drain region 13 of a two-layer structure. Gate electrode layer 17 is formed on a region located between source region 9 and drain region 13 with gate insulating layer 15 therebetween, and is made of, for example, polycrystalline silicon containing impurity.

An n⁺ diffusion region 21 adjoining to source region 9 is formed at the surface of n⁻ epitaxial layer 3.

The control element is an element forming a circuit for controlling high breakdown voltage pch-MOSFET 10A and, for example, corresponds to a pch-MOSFET 30. Pch- MOSFET 30 has a pair of p-type diffusion regions 31, a gate insulating layer 33 and a gate electrode layer 35. The pair of p-type diffusion regions 31 forming source/drain regions are formed at a surface of n⁻ epitaxial layer 3 with a space between each other. Gate electrode layer 35 is formed on a region between paired p-type diffusion regions 31 with gate insulating layer 33 therebetween.

Only the n-type region of n⁻ epitaxial layer 3 is present between high breakdown voltage pch-MOSFET 10A and control element 30.

High breakdown voltage pch-MOSFET 10A and control element 30 are covered with an insulating layer 23. Insulating layer 23 is provided with a contact hole 23a exposing source region 9 and a partial surface of n⁺ diffusion region 21, a contact hole 23b exposing a partial surface of p-type diffusion region 13b, a contact hole 23c exposing a partial surface of p-type isolation diffusion region 5, and contact holes 23d exposing partial surfaces of paired p-type diffusion regions 31.

An interconnection layer 25a forming a source electrode is electrically connected to p-type diffusion region 9 and n⁺ diffusion region 21 through contact hole 23a. An interconnection layer 25b forming a drain electrode is electrically connected to p-type diffusion region 13b through contact hole 23b. An interconnection layer 25c is electrically connected to p-type isolation diffusion region 5 through contact hole 23c. Interconnection layers 25d are electrically connected to p-type diffusion regions 31 through contact holes 23d, respectively. These interconnection layers 25a, 25b, 25c and 25d are made of, e.g., aluminum.

Interconnection layers 25b and 25c are electrically connected together via a resistor 27.

High breakdown voltage pch-MOSFET 10A has a breakdown voltage of 150 V or more. In other words, a breakdown voltage between source and drain regions 9 and 13 in high breakdown voltage pch-MOSFET 10A is 150 V or more. In order to ensure this breakdown voltage, p⁻ diffusion region 13a has a distance L (FIG. 2) of 50 μm or more between an end near p-type diffusion region 13b and the other end near gate electrode 17.

N⁺ buried diffusion region 7 is present at least at a region immediately under the control element, and preferably has an extended portion located immediately under source region 9 of high breakdown voltage pch-MOSFET 10A.

High breakdown voltage pch-MOSFET 10A is located nearer to the end of n⁻ epitaxial layer 3 than control element 30. Source region 9 of high breakdown voltage pch-MOSFET 10A is disposed near the control element, and drain region 13 is disposed near p-type diffusion region 5.

An operation of the semiconductor device of this embodiment will be described below.

The circuit formed of control element 30 and others negatively biases the potential on gate electrode layer 17 with respect to the potential on source electrode 25a, so that high breakdown voltage pch-MOSFET 10A is turned on. Thereby, a current flows through resistor 27, generating a voltage signal. In this manner, the level shift-down function is achieved.

In this embodiment, a depletion region 50 defined by dotted line in FIG. 2 appears when a high potential is applied to n⁻ epitaxial layer 3. Depletion region 50 expands from the pn junction between n⁻ epitaxial layer 3 and p-type isolation diffusion region 5 and the pn junction between n⁻ epitaxial layer 3 and p⁻ silicon substrate region 1 to the vicinity of the outer periphery of n⁻ epitaxial layer 3. Thereby, a portion of high breakdown voltage pch-MOSFET 10A, which includes gate electrode 17 and extending therefrom to the end near drain region 13, is taken into depletion region 50 except for a portion of p-type diffusion region 13b.

Even when depletion region 50 appears as described above, high breakdown voltage pch-MOSFET 10A is turned on and operated accurately by applying a potential to gate electrode layer 17 to form an inverted layer immediately under the same.

In the semiconductor device of this embodiment, only the n-type region of n⁻ epitaxial layer 3 is present between high breakdown voltage pch-MOSFET 10A and control element 30. In other words, p-type isolation diffusion region 5 which is a substrate potential region is not present between high breakdown voltage pch-MOSFET 10A and control element 30. Therefore, interconnection layers (i.e., gate electrode layer 17 and source electrode 25a set to a high potential) connecting high breakdown voltage pch-MOSFET 10A and control element 30 do not extend over p-type isolation diffusion region 5. Therefore, such a situation can be prevented that extension of the depletion region is suppressed due extension of the interconnection layers over p-type isolation diffusion region 5. Accordingly, it is not necessary to increase a film thickness of insulating layer 23 between the interconnection layers and the substrate. A time for deposition of insulating layer 23 can be significantly shorter than that in the prior art, and a good throughput can be achieved.

Figure 16:
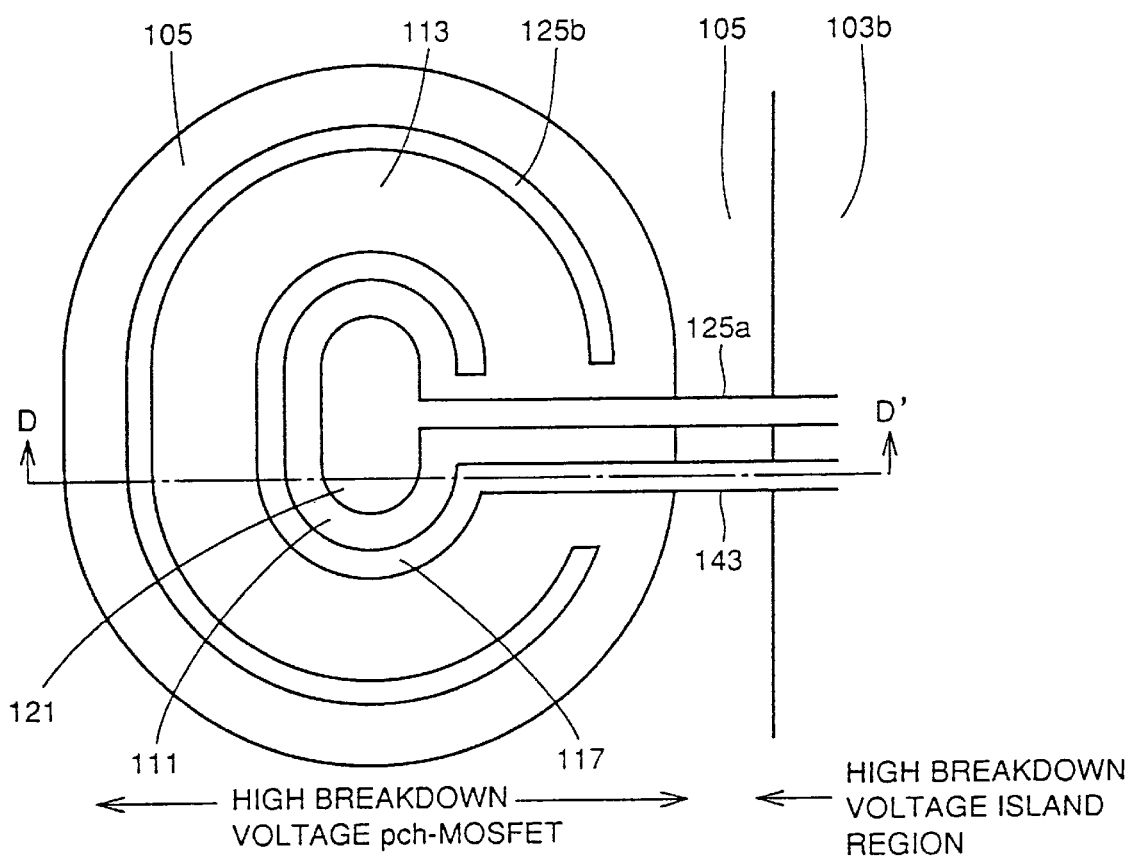
FIG. 16 is a plan schematically showing a structure of a semiconductor device in the prior art.
Figure 17:
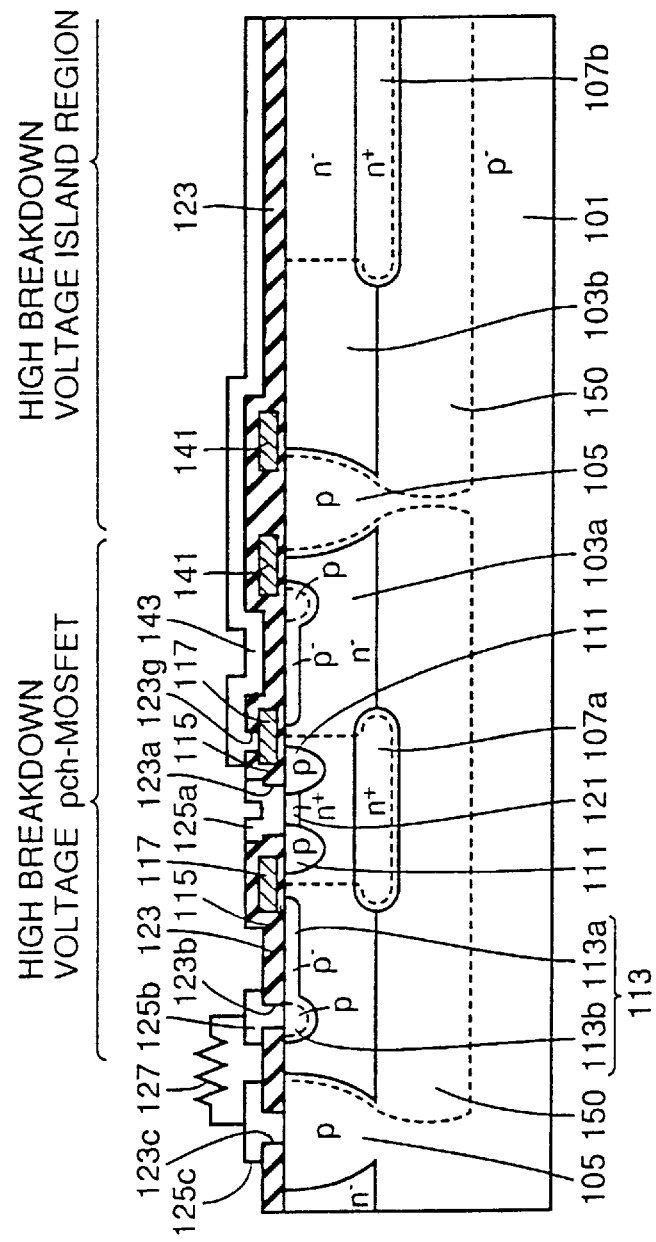
FIG. 17 is a schematic cross section taken along line D–D' in FIG. 16.

In the prior art shown in FIGS. 16 and 17, an element cannot be arranged at the vicinity of the end of the high breakdown voltage island region, because the depletion region expands thereto. Meanwhile, a high breakdown voltage is ensured in the high breakdown voltage pch-MOSFET by actively depleting a region between gate electrode layer 17 and the end near drain region 13. This allows arrangement of the high breakdown voltage pch-MOSFET near the end of the high breakdown voltage island region. Accordingly, in the semiconductor device of the embodiment, high breakdown voltage pch-MOSFET 10A is disposed near the end of the high breakdown voltage island region, i.e., near p-type isolation diffusion region 5.

According to the semiconductor device of this embodiment, high breakdown voltage pch-MOSFET 10A and control element 30 are formed in the common n⁻ epitaxial layer 3, so that it is not necessary to provide a high breakdown voltage pch-MOSFET formation region independently from the high breakdown voltage island region. Also, the high breakdown voltage pch-MOSFET can be disposed in the high breakdown voltage island region without enlarging the conventional high breakdown voltage island region. Accordingly, increase in the chip area can be significantly suppressed.

Since it is not necessary to provide p-type isolation diffusion region 5 between high breakdown voltage pch-MOSFET 10A and control element 30, a planar area occupied by the structure can be reduced.

Figure 4:
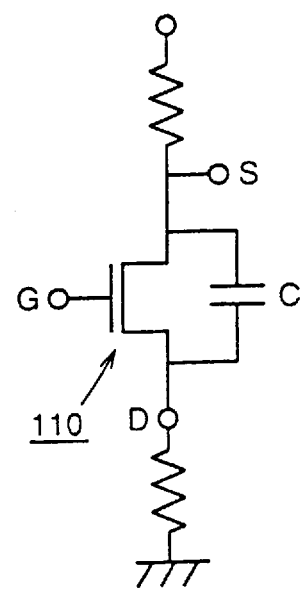
FIG. 4 is a circuit diagram showing generation of a parasitic capacitance in a high breakdown voltage pch-MOSFET.

In the prior art shown in FIGS. 16 and 17, since the high breakdown voltage pch-MOSFET has a track-like form, source region 111 and drain region 113 are opposed to each other through a large area. This results in increase in parasitic capacitance C of the capacitor formed of a source region S and a drain region D in a high breakdown voltage pch-MOSFET 110, as shown in FIG. 4. Therefore, a charge/discharge current (dV/dt current) of the capacitor, which is generated due to change in potential at the source region S side or the drain region D side, attains a level similar to that of a signal current, which impedes the level shift operation.

Meanwhile, in the semiconductor device of this embodiment, high breakdown voltage pch-MOSFET 10A has source region 9 and drain region 13 which are opposed to each other through a straight area as shown in FIGS. 1 and 2. Therefore, the parasitic capacitance of high breakdown voltage pch-MOSFET 10A can be small. This significantly reduces the charge/discharge current of the capacitor formed between the source region 9 and the drain region 13 in the high breakdown voltage pch-MOSFET, and therefore an accurate operation of the element can be achieved.

In the semiconductor device of the embodiment, p-type isolation diffusion region 5 is not present between high breakdown voltage pch-MOSFET 10A and the control element formation region. However, flow of the main current of high breakdown voltage pch-MOSFET 10A to the high breakdown voltage island region itself can be prevented by always establishing such a relationship that the source potential of the high breakdown voltage pch-MOSFET does not exceed the island potential of the high breakdown voltage island region (i.e., potential of $n^-$ epitaxial layer 3). Thus, electrical isolation can be sufficiently ensured between high breakdown voltage pch-MOSFET 10A and control element formation region 30 by setting the respective potentials as described above, even if pn isolation is not present between high breakdown voltage pch-MOSFET 10A and control element formation region 30.

In this embodiment, $n^+$ buried diffusion region 7 is located at a region immediately under control element 30. During operation of the high breakdown voltage pch-MOSFET, $n^+$ buried diffusion region 7 prevents extension of a depletion region from the pn junction between $n^+$ buried diffusion region 7 and $p^-$ silicon substrate 1 toward control element 30. Accordingly, the depletion region does not extend to the vicinities of source/drain regions 31 of the control element 30, and thus disadvantages such as punch through of control element 30 are prevented.

Figure 3:
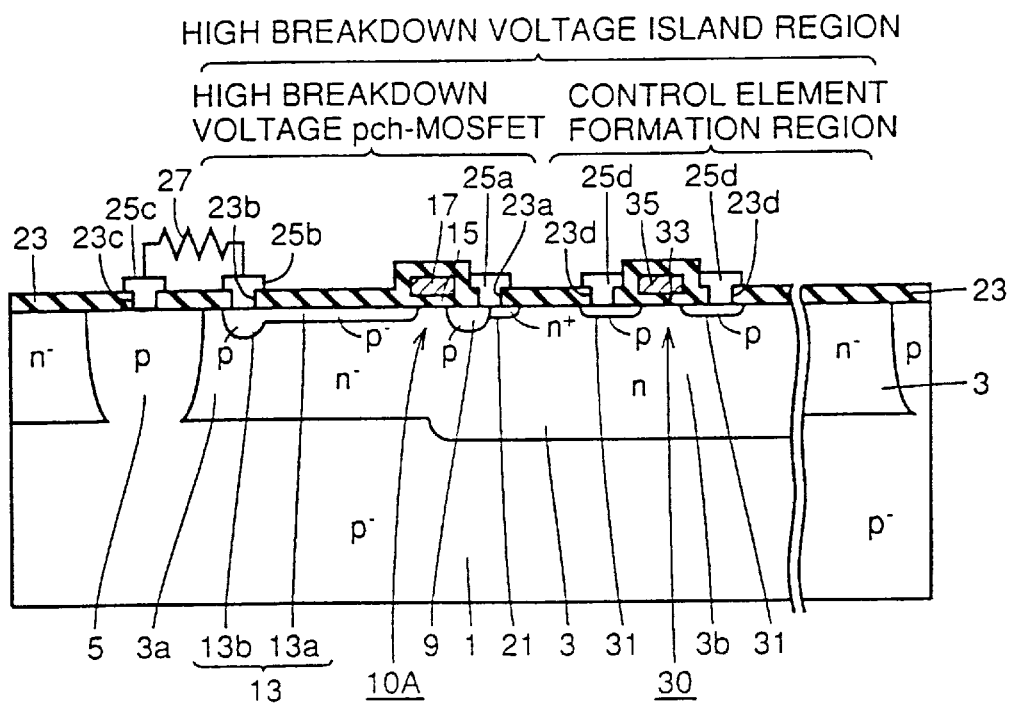
FIG. 3 is a cross section schematically showing a modification of a high breakdown voltage island region in the semiconductor device forming the level shift structure according to the embodiment 1 of the invention.

With reference to FIGS. 1 and 2, description has been given on the structure in which $n^+$ buried diffusion region 7 is in contact with the lower surface of $n^-$ epitaxial layer 3. However, n-type region 3 forming the high breakdown voltage island region may have a two-layer structure formed of an $n^-$ region 3a and an n-type region 3b, as shown in FIG. 3. In this case, n-type region 3b is formed at a central portion of the high breakdown voltage island region where control element 30 is formed. $N^-$ region 3a surrounds n-type region 3b in the high breakdown voltage island region, and is located at a region where drain region 13 of high breakdown voltage pch-MOSFET 10A is formed. N-type region 3b may have an extended portion located immediately under source region 9 of the high breakdown voltage pch-MOSFET.

In the structure shown in FIG. 3, since control element 30 is formed in relatively heavily doped n-type region 3, punch through of the control element can be prevented, as is done in the structure already described.

Embodiment 2

Figure 5:
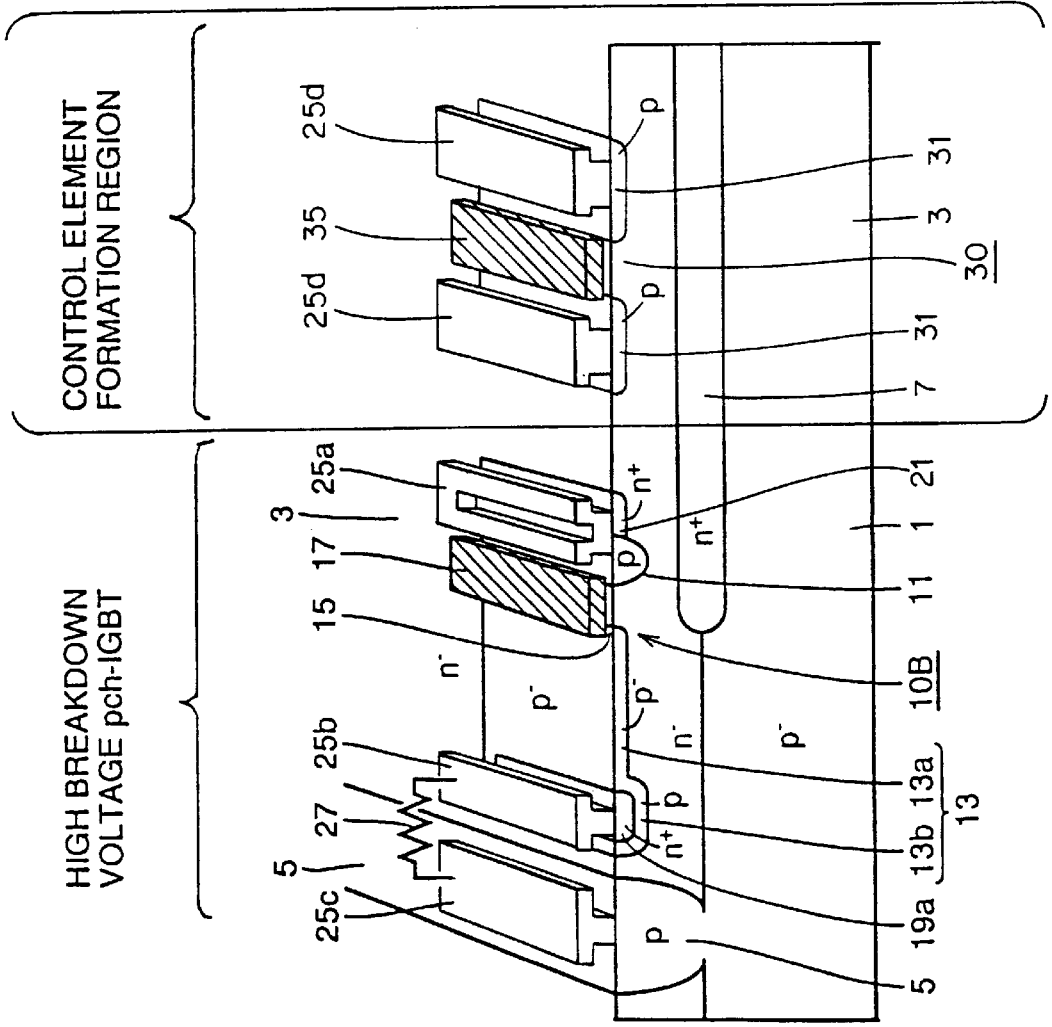
FIG. 5 is a perspective view schematically showing a structure of a semiconductor device forming a level shift structure according to an embodiment 2 of the invention.
Figure 6:
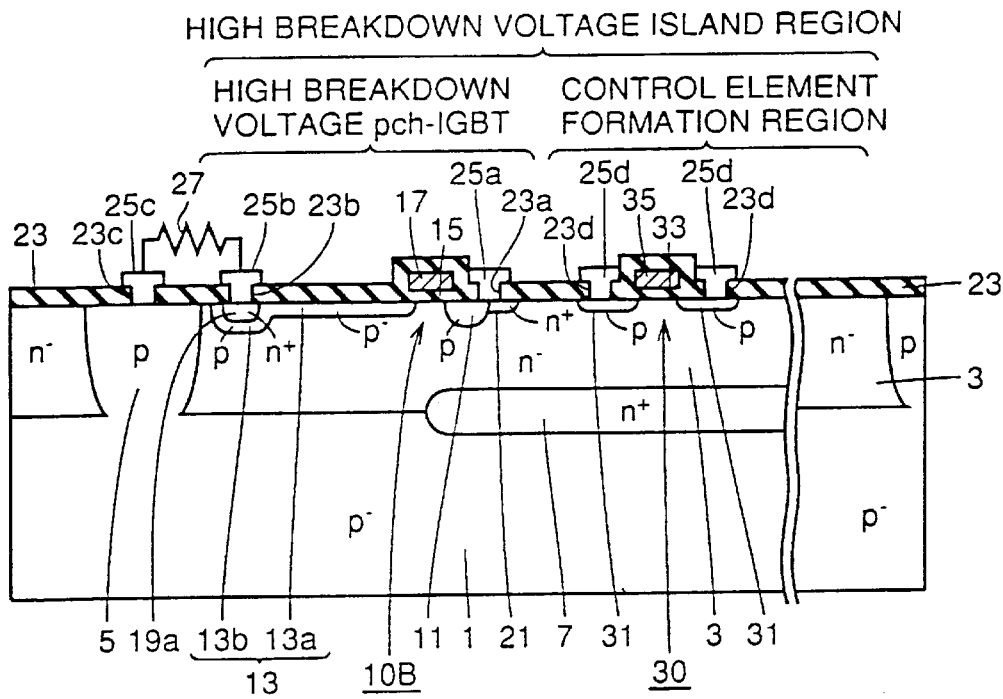
FIG. 6 is a cross section schematically showing a structure of the semiconductor device forming the level shift structure according to the embodiment 2 of the invention.

Referring to FIGS. 5 and 6, a semiconductor device of an embodiment 2 includes, in addition to the structures of the embodiment 1, an $n^+$ diffusion region 19a, so that a high breakdown voltage pch-IGBT 10B is formed. High breakdown voltage pch-IGBT 10B is formed of p-type diffusion region 11, $p^-$ diffusion region 13a, p-type diffusion region 13b, $n^+$ diffusion region 19a, gate insulating layer 15 and gate electrode layer 17.

$N^+$ diffusion region 19a is formed at a substrate surface in p-type diffusion region 13b. Electrode 25b is in contact with only a surface of $n^+$ diffusion region 19a.

Structures other than the above are the same as those of the embodiment 1. The same parts and portions bear the same reference numbers, and will not be described below.

In this embodiment, the high breakdown voltage element operates as a pch-IGBT owing to the structure shown in FIGS. 5 and 6. The operation will now be described below.

The circuit formed of control element 30 negatively biases the potential on gate electrode layer 17 with respect to the potential on source electrode 25a. Thereby, an inverted layer is formed immediately under gate electrode layer 17, and a hole current flows through $p^-$ diffusion region 13a into p-type diffusion region 13b. This hole current forwardly biases the pn junction formed of $n^+$ diffusion region 19a and p-type diffusion region 13b. Thereby, an npn bipolar transistor formed of $n^-$ epitaxial layer 3, p-type diffusion region 13b and $n^+$ diffusion region 19a is turned on. An electron current flows through $n^-$ epitaxial layer 3 toward $n^+$ diffusion region 21.

By the above IGBT operation of the high breakdown voltage element, the on-current during the on-operation can be larger than that in the embodiment 1. Therefore, the element formation region of the high breakdown voltage element can be further reduced in size compared with the embodiment 1.

Figure 7:
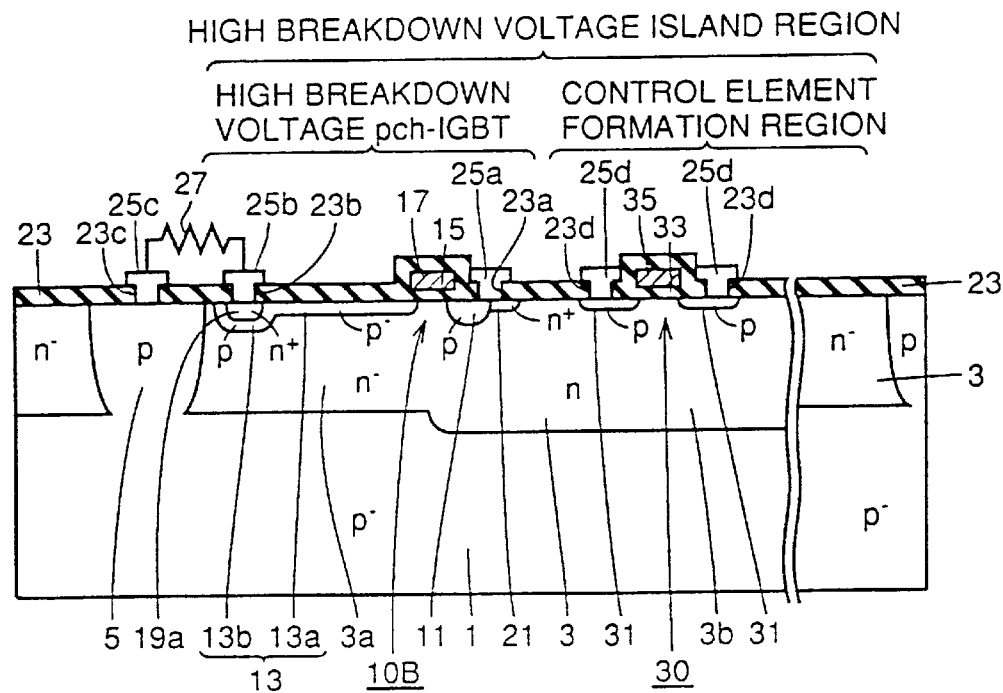
FIG. 7 is a cross section schematically showing a modification of a high breakdown voltage island region in the semiconductor device forming the level shift structure according to the embodiment 2 of the invention.

Instead of provision of $n^+$ buried diffusion region 7 shown in FIGS. 5 and 6, the n-type region forming the high breakdown voltage island region may have a two-layer structure formed of $n^-$ type region 3a and n-type region 3b as shown in FIG. 7.

Embodiment 3

Figure 8:
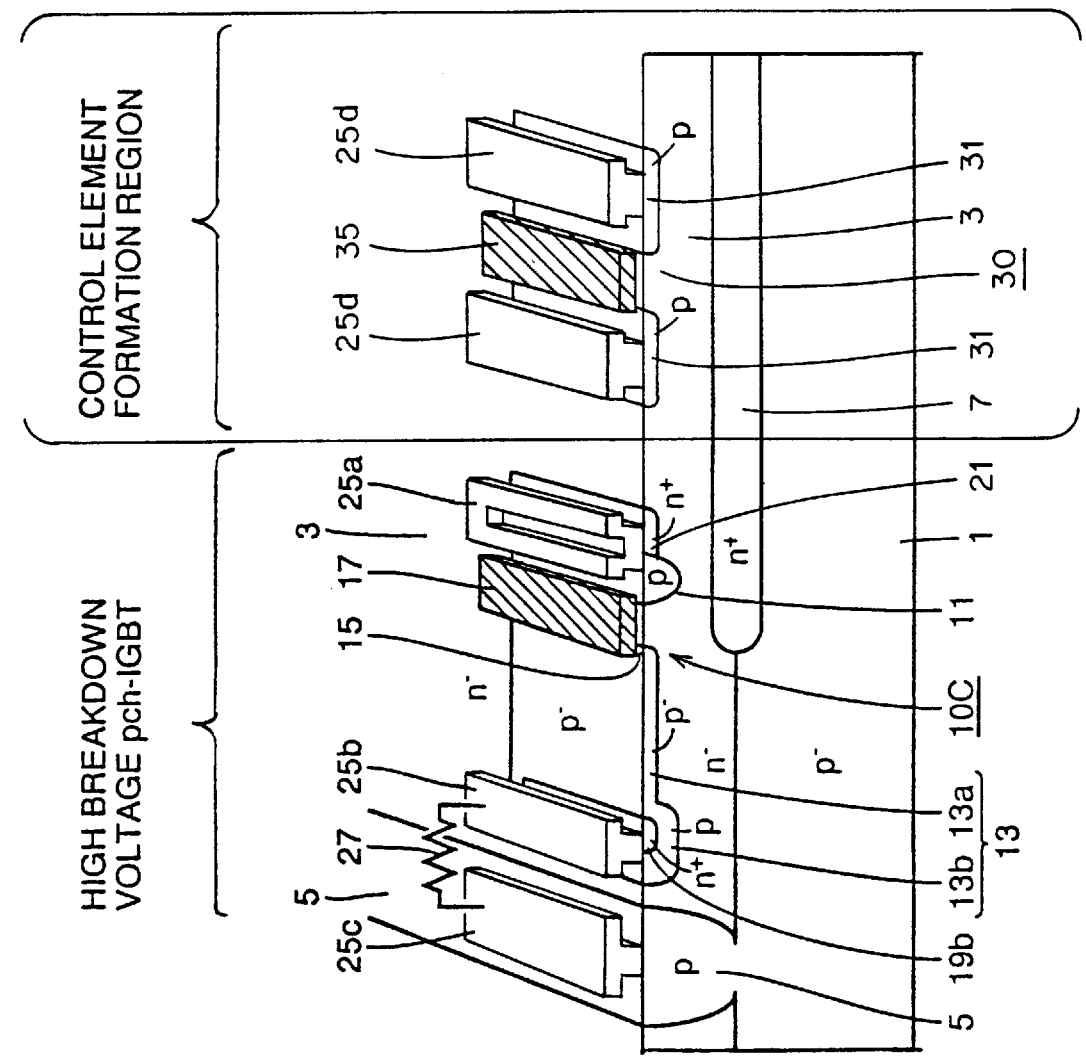
FIG. 8 is a perspective view schematically showing a structure of a semiconductor device forming a level shift structure according to an embodiment 3 of the invention.
Figure 9:
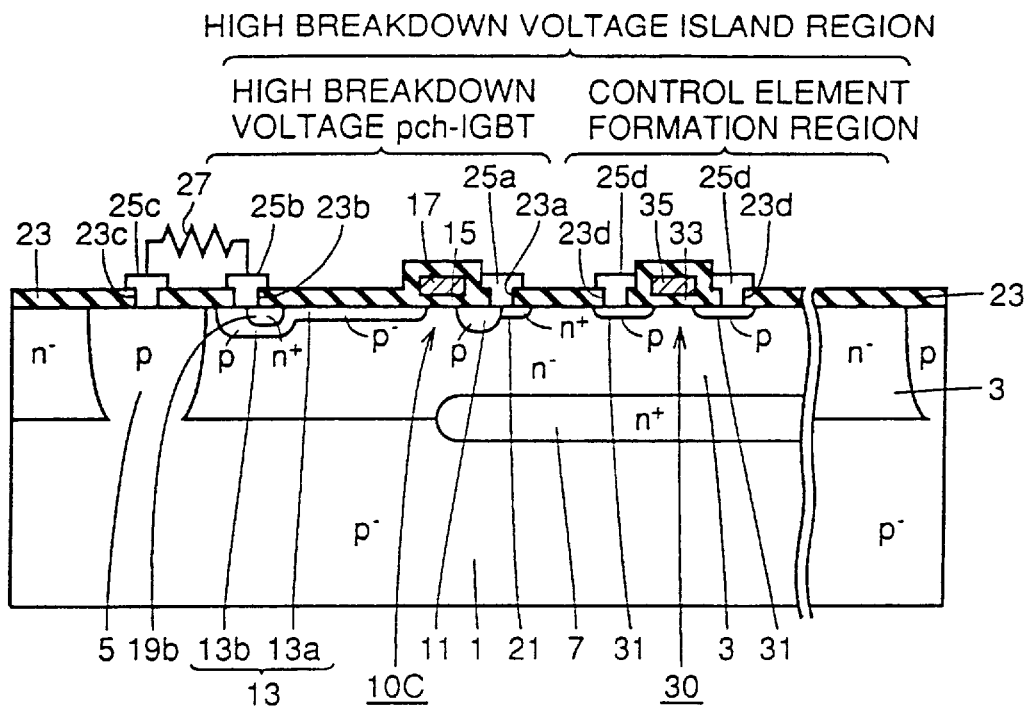
FIG. 9 is a cross section schematically showing a structure of the semiconductor device forming the level shift structure according to the embodiment 3 of the invention.

Referring to FIGS. 8 and 9, a semiconductor device of this embodiment includes electrode 25b, which is also employed in the embodiment 2 but is connected to both of p-type diffusion region 13b and $n^+$ diffusion region 19a.

Structures other than the above are the same as those of the embodiment 2. The same parts and portions bear the same reference numbers, and will not be described below.

In the embodiment 2 described before, p-type diffusion region 13b is floated. Therefore, if a current amplification factor $h_{FE}$ of an npn bipolar transistor formed of $n^-$ epitaxial layer 3, p-type diffusion region 13b and $n^+$ diffusion region 19b is large, $BV_{CEO}$ (i.e., voltage between collector and emitter with base open) of this npn bipolar transistor may restrict the breakdown voltage, before a high breakdown voltage is achieved by an RESURF effect. Also, in the embodiment 2, a large charge/discharge current (dV/dt) of a capacitor caused by a parasitic capacitance between p-type diffusion region 11 and p-type diffusion region 13 may turn on the above npn bipolar transistor.

In contrast to this, the above problem does not arise in the embodiment 3, because electrode 23b is connected to both of $n^+$ diffusion region 19b and p-type diffusion region 13b.

However, the on-operation of this embodiment is slightly different from that of the embodiment 2. In this embodiment, the npn bipolar transistor is turned on by the voltage drop which occurs when the hole current flows through p-type diffusion region 13b immediately under $n^+$ diffusion region 19b. Therefore, the IGBT operation is weakened compared with the embodiment 2. This disadvantage, however, can be overcome, for example, by further improving a connection structure between $n^+$ diffusion region 19b and electrode 25b.

Figure 10:
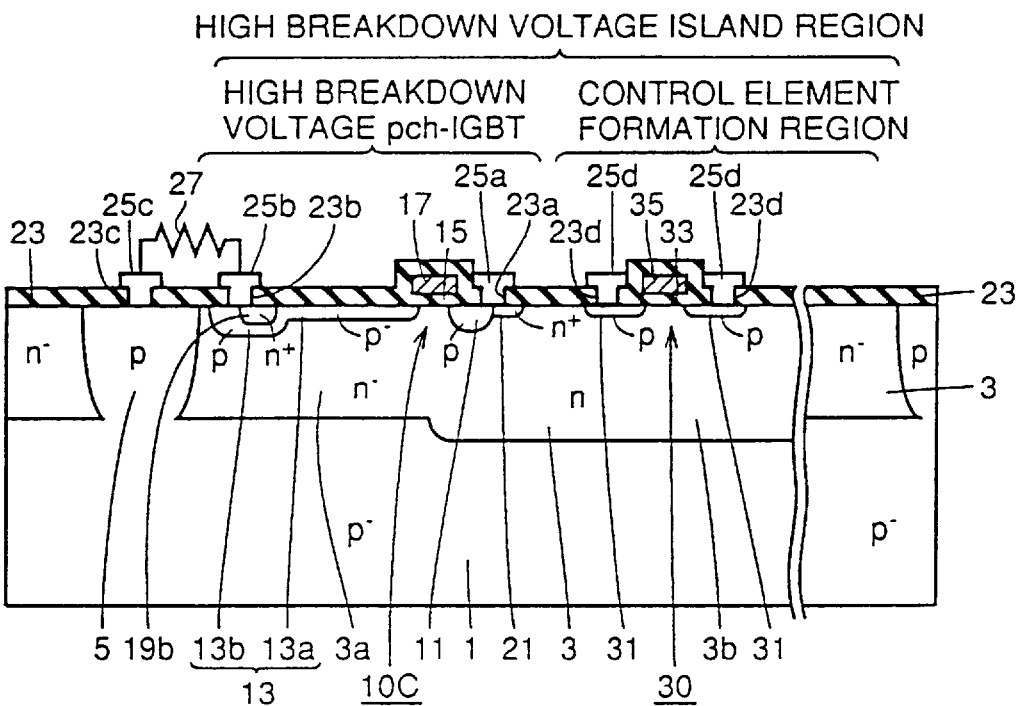
FIG. 10 is a cross section schematically showing a modification of a high breakdown voltage island region in the semiconductor device forming the level shift structure according to the embodiment 3 of the invention.

Instead of provision of $n^+$ buried diffusion region 7 shown in FIGS. 8 and 9, n-type region 3 forming the high breakdown voltage island region may have a two-layer structure formed of $n^-$ region 3a and n-type region 3b as shown in FIG. 10.

Embodiment 4

Figure 11:
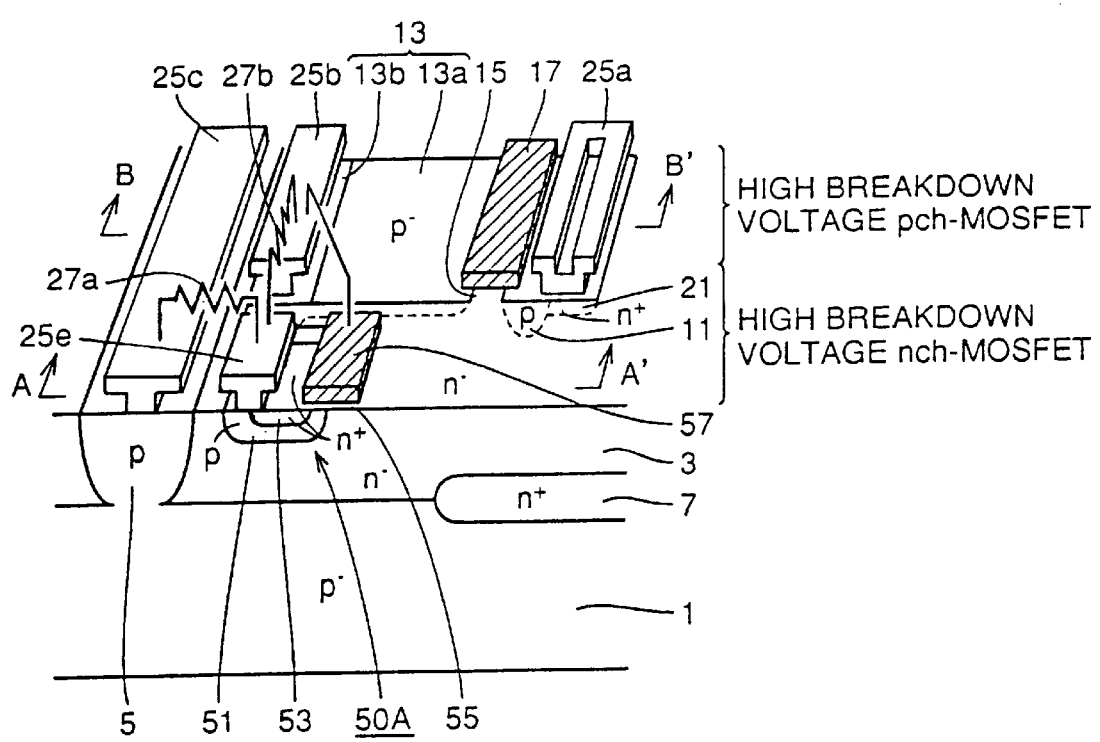
FIG. 11 is a perspective view schematically showing a structure of a semiconductor device forming a level shift structure according to an embodiment 4 of the invention.

In an embodiment 4, a structure taken along line B–B' in FIG. 11 is the same as that shown in FIG. 2.

Figure 12:
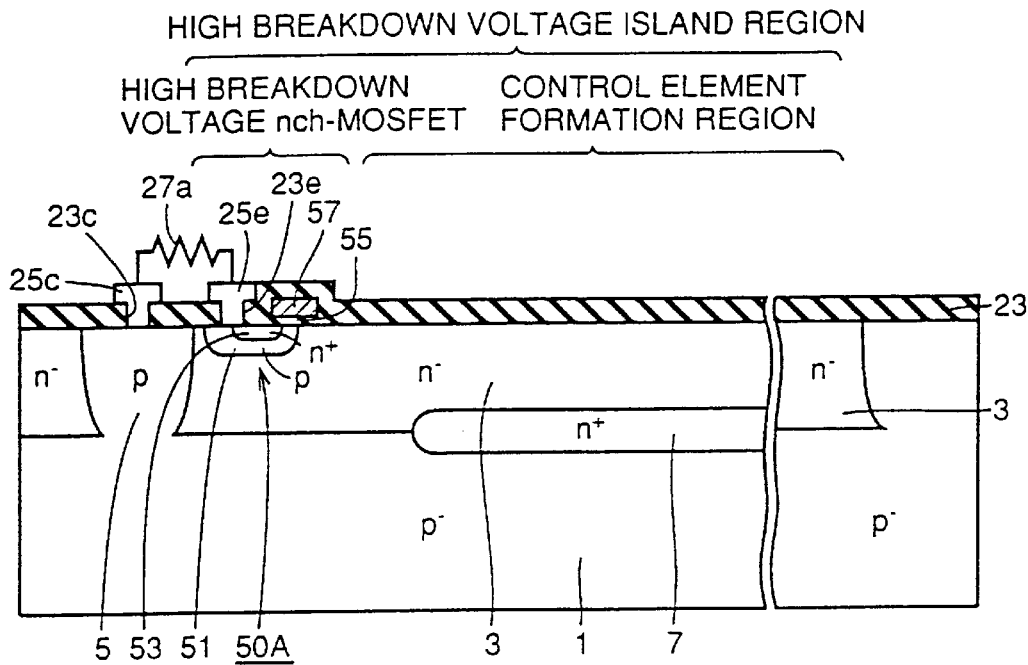
FIG. 12 is a cross section schematically showing a structure of the semiconductor device forming the level shift structure according to the embodiment 4 of the invention.

Referring to FIGS. 2, 11 and 12, $n^-$ epitaxial layer 3 is formed at the surface of $p^+$ silicon substrate 1. $N^+$ buried diffusion region 7 is formed in contact with the lower surface of n⁻ epitaxial layer 3. N⁺ epitaxial layer 3 is surrounded by p-type isolation diffusion region 5 at the substrate surface, and thereby forms the high breakdown voltage island region.

In this embodiment, high breakdown voltage pch-MOSFET 10A, a high breakdown voltage nch-MOSFET 50A and control element 30 which forms a circuit controlling these transistors are formed in this high breakdown voltage island region.

High breakdown voltage nch-MOSFET 50A is disposed along the end of the high breakdown voltage island region and is adjacent to high breakdown voltage pch-MOSFET 10A. High breakdown voltage nch-MOSFET 50A has a p-type diffusion region 51, an n⁺ diffusion region 53, a gate insulating layer 55 and a gate electrode layer 57. P-type diffusion region 51 is selectively formed at the surface of n⁻ epitaxial layer 3. N⁺ diffusion region 53 is formed at a surface in p-type diffusion region 51. Gate electrode layer 57 is formed on a region of p-type diffusion region 51 between n⁺ diffusion region 53 and n⁻ epitaxial layer 3 with gate insulating layer 55 therebetween. High breakdown voltage nch-MOSFET 50A forms a DMOSFET.

There is formed an electrode 25e which is electrically connected to both of n⁺ diffusion region 53 and p-type diffusion region 51 through a contact hole 23e.

Electrode 25e is electrically connected to electrode 25c via a resistor 27a, and is electrically connected to electrode 25b via a resistor 27b. Electrode 25b is electrically connected to gate electrode layer 57 of high breakdown voltage nch-MOSFET 50A.

Structures of high breakdown voltage pch-MOSFET 10A and control element 30 are the same as those of the embodiment 1 shown in FIGS. 1 and 2. The same parts and portions bear the same reference numbers, and will not be described below.

High breakdown voltage pch-MOSFET 10A of this embodiment performs the same operation as that of the embodiment 1, and further performs an additional operation. As already described in connection with the embodiment 1, turn-on of high breakdown voltage pch-MOSFET 10A generates a voltage on resistor 27b. When this voltage is applied to gate electrode layer 57 of high breakdown voltage nch-MOSFET 50A, an inverted layer appears at p-type diffusion region 51 immediately under gate electrode layer 57, and high breakdown voltage nch-MOSFET 50A is turned on. By turn-on of high breakdown voltage nch-MOSFET 50A, a current flows via resistor 27a and a current signal is generated. In this manner, the level shift-down function is achieved.

According to the semiconductor device of this embodiment, since high breakdown voltage pch-MOSFET 10A is used only for driving gate electrode layer 57 in high breakdown voltage nch-MOSFET 50A, it occupies a small planar area. Since mobility of electrons in high breakdown voltage nch-MOSFET 50A is larger than that of holes, an on-current which can flow in high breakdown voltage nch-MOSFET 50A can be generally three times larger than that in high breakdown voltage pch-MOSFET 10A, if these MOSFETs occupy equal planar areas. Therefore, a whole planar area occupied by the high breakdown voltage elements can be smaller than that in the embodiment 1.

Since all the elements perform the MOSFET operation, the operation speed can be higher than that of the IGBT operations of the embodiments 2 and 3. Since no portion performs a bipolar operation, possibility of latch-up by a parasitic thyristor operation can be small.

Figure 13:
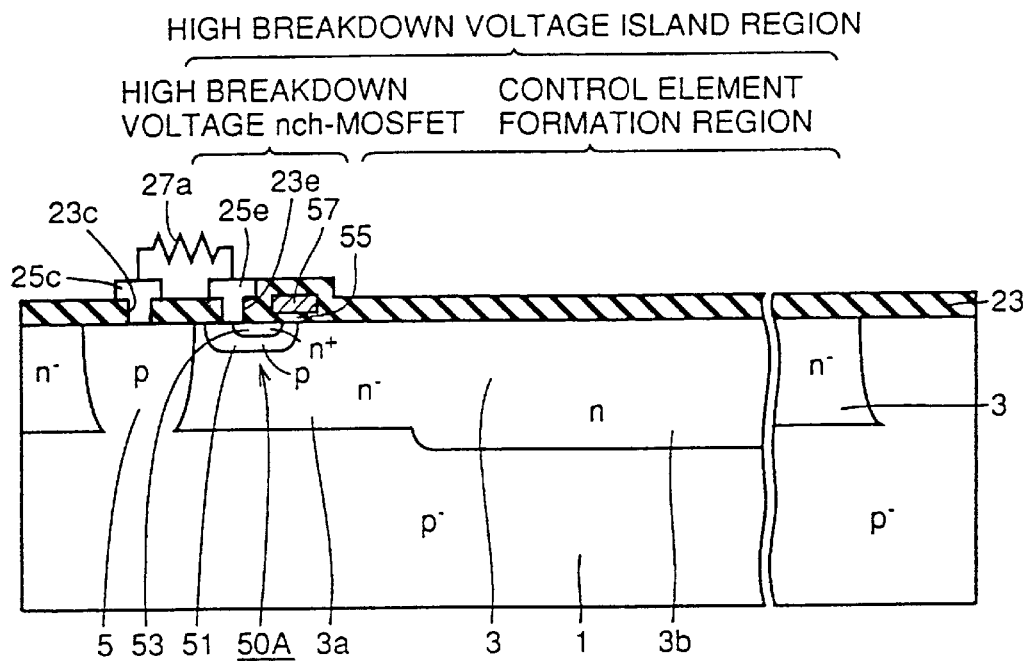
FIG. 13 is a cross section schematically showing a modification of a high breakdown voltage island region in the semiconductor device forming the level shift structure according to the embodiment 4 of the invention.

Instead of provision of n⁺ buried diffusion region 7 shown in FIGS. 11 and 12, n-type region 3 forming the high breakdown voltage island region may have a two-layer structure formed of n⁻ region 3a and n-type region 3b as shown in FIG. 13.

Embodiment 5

Figure 14:
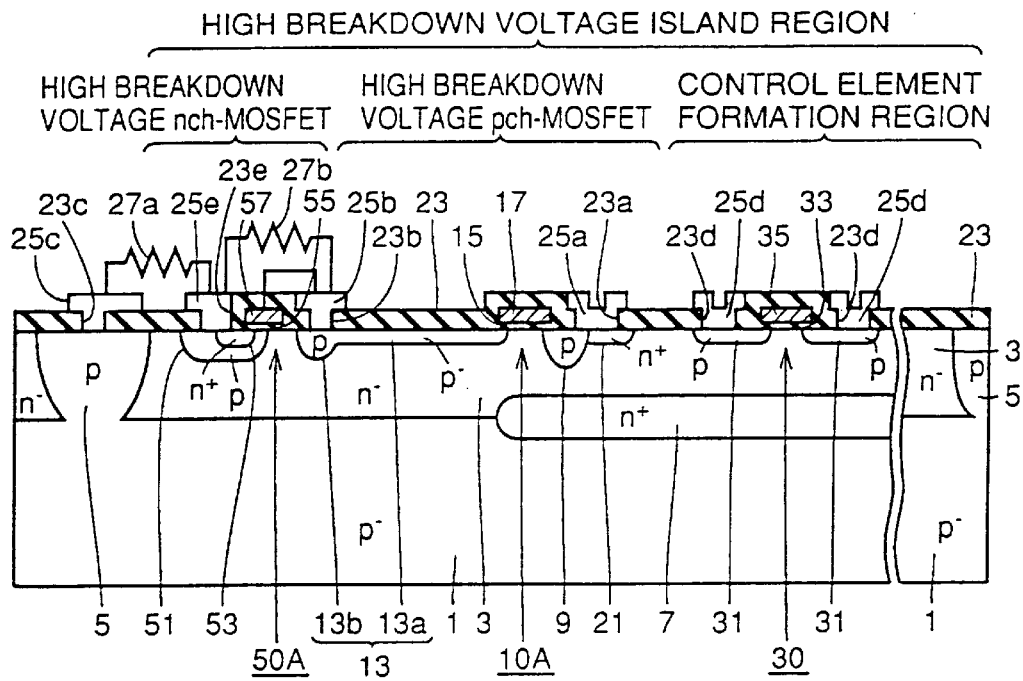
FIG. 14 is a cross section schematically showing a structure of the semiconductor device forming the level shift structure according to the embodiment 5 of the invention.

Referring to FIG. 14, a semiconductor device of an embodiment 5 includes, as high breakdown voltage elements, high breakdown voltage pch-MOSFET 10A and high breakdown voltage nch-MOSFET 50A, as is done in the embodiment 4. In this embodiment, high breakdown voltage nch-MOSFET 50A is located nearer to the end of the high breakdown voltage island region than high breakdown voltage pch-MOSFET 10A. The source/drain regions of high breakdown voltage nch-MOSFET 50A and source/drain regions 9 and 13 of high breakdown voltage pch-MOSFET 10A are disposed on a straight line.

The respective structures of nch-MOSFET 50A and pch-MOSFET 10A are the same as those in the embodiment 4. The same parts and portions bear the same reference numbers, and will not be described below.

The whole operation of high breakdown voltage elements is the same as that of the embodiment 4.

In this embodiment, source/drain regions 9 and 13 of high breakdown voltage pch-MOSFET 10A and the source/drain regions of high breakdown voltage nch-MOSFET 50A are disposed on the same straight line. Therefore, a planar area occupied by the high breakdown voltage elements can be further reduced from that in the embodiment 4.

Figure 15:
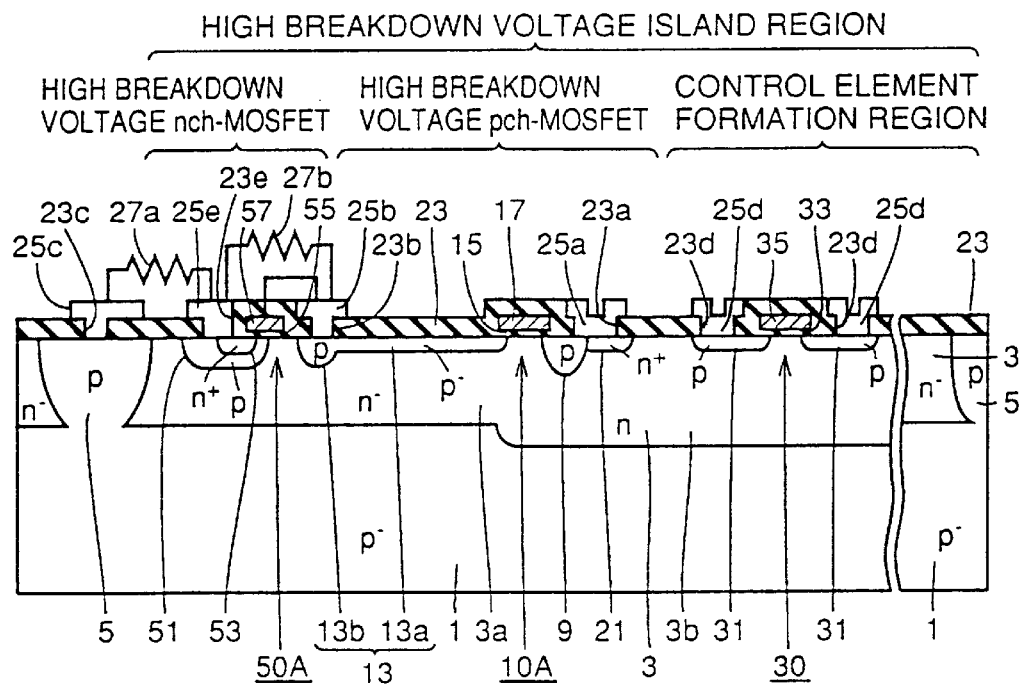
FIG. 15 is a cross section schematically showing a modification of a high breakdown voltage island region in the semiconductor device forming the level shift structure according to the embodiment 5 of the invention.

As shown in FIG. 15, n-type region 3 forming the high breakdown voltage island region may have a two-layer structure formed of n⁻ region 3a and n-type region 3b.

According to the semiconductor device of the invention, since only the region of the first conductivity type is present between the high breakdown voltage element and the control element, the interconnection layer connecting the high breakdown voltage element and the control element is not located above the pn junction between the region of the first conductivity type and the region of the second conductivity type. Therefore, extension of a depletion layer at this pn junction is not suppressed, so that it is not necessary to increase a film thickness of the insulating layer between the interconnection layer and the substrate. Therefore, a deposition time for this insulating layer can be significantly smaller than that in the prior art, an a throughput can be improved.

Since the high breakdown voltage element and the control element are formed at the same impurity region, a planar area occupied by the structure can be small. Therefore, increase in the chip area can be suppressed.

In a preferred aspect, since the control element is arranged in the second region having a relatively high concentration, extension of the depletion layer toward the control element is prevented. Thereby, punch through can be prevented if the control element is, for example, an MOS transistor.

In a preferred aspect, since the second region having a relatively high concentration is disposed at a region immediately under the control element, it is possible to prevent extension of the depletion layer from a position under the control element toward the control element. Thereby, punch through can be prevented if the control element is, for example, an MOS transistor.

In a preferred aspect, additional provision of the fourth impurity region allows an IGBT operation of the high breakdown voltage element. Therefore, the on-current which flows during the on-state of IGBT can be larger than that in the conventional MOS transistor, so that the region for forming the high breakdown voltage element can be further reduced in size.

In a preferred aspect, connection of the heavily doped region to the electrode prevents a floating state. Therefore, even if the current amplification factor $h_{FE}$ of the bipolar transistor portion formed of the fourth impurity region, the heavily doped region and the first impurity region is large, the breakdown voltage of the bipolar transistor portion does not decrease, because the electrical connection is made between the base and emitter in this bipolar transistor. Therefore, the breakdown voltage of the high breakdown voltage element does not affect the breakdown voltage of this bipolar transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate of a second conductivity type having a main surface;
   a first impurity region of a first conductivity type formed at the main surface of said semiconductor substrate;
   a second impurity region of a second conductivity type provided for isolation and surrounding a periphery of said first impurity region at said main surface;
   a high breakdown voltage element formed at the main surface of said semiconductor substrate and having a breakdown voltage of 150 V or more; and
   a control element formed at the main surface of said semiconductor substrate and forming a circuit controlling said high breakdown voltage element, wherein:
   said high breakdown voltage element and said control element are formed at the main surface within said first impurity region;
   only a region of the first conductivity type of said first impurity region is present at a region located along said main surface between said high breakdown voltage element and said control element;
   entire side and bottom surfaces of the first impurity region are surrounded by the second impurity region of the second conductivity type and the substrate, respectively;
   said high breakdown voltage element has a pair of third impurity regions of the second conductivity type arranged at said main surface with a distance interposed therebetween, one of the pair of said third impurity regions being capable of receiving a higher voltage than the other of the pair of said third impurity regions; and
   said control element is arranged closer to the one of the pair of said third impurity regions receiving high voltage than the other of the pair of said third impurity regions receiving low voltage.

2. The semiconductor device according to claim 1, wherein
   said high breakdown voltage element includes a high breakdown voltage insulated gate field effect transistor portion having a pair of third impurity regions of the second conductivity type disposed at said main surface and spaced from each other by a distance and a gate electrode layer formed on said main surface between said pair of third impurity regions with a gate insulating layer therebetween, and
   said high breakdown voltage insulated gate field effect transistor portion has a breakdown voltage of 150 V or more between said pair of third impurity regions.

3. The semiconductor device according to claim 2, wherein
   one of said pair of third impurity regions has a heavily doped region formed at said main surface, and a lightly doped region formed at said main surface between said heavily doped region and said gate electrode and being in contact with said heavily doped region, and
   a length of said lightly doped region along said main surface from an end near said gate electrode layer to an end near said heavily doped region is 50 μm or more.

4. The semiconductor device according to claim 3, wherein
   said high breakdown voltage element is disposed nearer to an end of said first impurity region closer to the second impurity region than said control element, and
   one of said third impurity regions is disposed nearer to the end of said first impurity region than the other third impurity region.

5. The semiconductor device according to claim 3, wherein
   said high breakdown voltage element further includes a fourth impurity region of the first conductivity type formed at said main surface in said heavily doped region.

6. A semiconductor device comprising:
   a semiconductor substrate of a second conductivity type having a main surface;
   a first impurity region of a first conductivity type formed at the main surface of said semiconductor substrate;
   a second impurity region of a second conductivity type provided for isolation and surrounding a periphery of said first impurity region at said main surface;
   a high breakdown voltage element formed at the main surface of said semiconductor substrate and having a breakdown voltage of 150 V or more; and
   a control element formed at the main surface of said semiconductor substrate and forming a circuit controlling said high breakdown voltage element, wherein:
   said high breakdown voltage element and said control element are formed at the main surface within said first impurity region;
   only a region of the first conductivity type of said first impurity region is present at a region located along said main surface between said high breakdown voltage element and said control element;
   entire side and bottom surfaces of the first impurity region are surrounded by the second impurity region of the second conductivity type and the substrate, respectively;
   said high breakdown voltage element includes a high breakdown voltage insulated gate field effect transistor portion having a pair of third impurity regions of the second conductivity type disposed at said main surface and spaced from each other by a distance and a gate electrode layer formed on said main surface between said pair of third impurity regions with a gate insulating layer therebetween;
   said high breakdown voltage insulated gate field effect transistor portion has a breakdown voltage of 150 V or more between said pair of third impurity regions;
   said first impurity region has a first region and a second region having a higher impurity concentration than that of said first region and adjoining said first region at said main surface; and
   one of said pair of third impurity regions is formed in said first region, and said control element is formed in said second region.

7. A semiconductor device comprising:

a semiconductor substrate of a second conductivity type having a main surface;

a first impurity region of a first conductivity type formed at the main surface of said semiconductor substrate;

a second impurity region of a second conductivity type provided for isolation and surrounding a periphery of said first impurity region at said main surface;

a high breakdown voltage element formed at the main surface of said semiconductor substrate and having a breakdown voltage of 150 V or more; and a control element formed at the main surface of said semiconductor substrate and forming a circuit controlling said high breakdown voltage element, wherein:

said high breakdown voltage element and said control element are formed at the main surface within said first impurity region;

only a region of the first conductivity type of said first impurity region is present at a region located along said main surface between said high breakdown voltage element and said control element;

entire side and bottom surfaces of the first impurity region are surrounded by the second impurity region of the second conductivity type and the substrate, respectively;

said high breakdown voltage element includes a high breakdown voltage insulated gate field effect transistor portion having a pair of third impurity regions of the second conductivity type disposed at said main surface and spaced from each other by a distance and a gate electrode layer formed on said main surface between said pair of third impurity regions with a gate insulating layer therebetween;

said high breakdown voltage insulated gate field effect transistor portion has a breakdown voltage of 150 V or more between said pair of third impurity regions;

said first impurity region has a first region and a second region having an impurity concentration higher than that of said first region and disposed in contact with a lower surface of said first region;

one of said pair of third impurity regions and impurity regions forming said control element are formed in said first region; and said second region is not disposed at a region immediately under one of said pair of third regions, and is disposed at a region under said impurity regions forming said control element.

8. A semiconductor device comprising:

a semiconductor substrate of a second conductivity type having a main surface;

a first impurity region of a first conductivity type formed at the main surface of said semiconductor substrate;

a second impurity region of a second conductivity type provided for isolation and surrounding a Periphery of said first impurity region at said main surface;

a high breakdown voltage element formed at the main surface of said semiconductor substrate and having a breakdown voltage of 150 V or more; and a control element formed at the main surface of said semiconductor substrate and forming a circuit controlling said high breakdown voltage element; wherein:

said high breakdown voltage element and said control element are formed at the main surface within said first impurity region;

only a region of the first conductivity type of said first impurity region is present at a region located along said main surface between said high breakdown voltage element and said control element;

entire side and bottom surfaces of the first impurity region are surrounded by the second impurity region of the second conductivity type and the substrate, respectively;

said high breakdown voltage element includes a high breakdown voltage insulated gate field effect transistor portion having a pair of third impurity regions of the second conductivity type disposed at said main surface and spaced from each other by a distance and a gate electrode layer formed on said main surface between said pair of third impurity regions with a gate insulating layer therebetween;

said high breakdown voltage insulated gate field effect transistor portion has a breakdown voltage of 150 V or more between said pair of third impurity regions;

one of said pair of third impurity regions has a heavily doped region formed at said main surface, and a lightly doped region formed at said main surface between said heavily doped region and said gate electrode and being in contact with said heavily doped region; and a length of said lightly doped region along said main surface from an end near said gate electrode layer to an end near said heavily doped region is 50 $\mu$m or more, said semiconductor device further comprising:

a second high breakdown voltage insulated gate field effect transistor having a fourth impurity region of the second conductivity type formed at said main surface in said first impurity region;

a fifth impurity region of the first conductivity type formed at said main surface in said fourth impurity region; and a second gate electrode layer formed on said fourth impurity region located between said fifth impurity region and said first impurity region with a second gate insulating layer therebetween, wherein said second gate electrode layer is electrically connected to one of said third impurity regions, said fourth and fifth impurity regions are electrically connected to one of said pair of third impurity regions via a first resistor, and said fourth and fifth impurity regions are electrically connected to said second impurity region via a second resistor.

9. The semiconductor device according to claim 8, wherein said second high breakdown voltage field-effect transistor is disposed nearer to an end of said first impurity region than said high breakdown voltage field-effect transistor.

* * * * *